United States Patent [19]

Klose

[11] 4,319,225
[45] Mar. 9, 1982

[54] METHODS AND APPARATUS FOR COMPACTING DIGITAL DATA

[75] Inventor: Dirk R. Klose, Eatontown, N.J.

[73] Assignee: The United States of America as represented by the Secretary of the Army, Washington, D.C.

[21] Appl. No.: 470,786

[22] Filed: May 17, 1974

[51] Int. Cl.³ .............................................. H03K 13/24
[52] U.S. Cl. ............................................. 340/347 DD
[58] Field of Search ...................... 340/347 DD, 172.5; 235/154, 310

[56] References Cited

U.S. PATENT DOCUMENTS 3,064,239  11/1962  Svigals et al. ..................... 340/172.5
3,694,813   9/1972  Loh et al. ......................... 340/172.5
3,701,108  10/1972  Loh et al. ......................... 340/172.5
3,717,851   2/1973  Cocke et al. ...................... 340/172.5

Primary Examiner—Charles D. Miller
Attorney, Agent, or Firm—Nathan Edelberg; Sheldon Kanars; Jeremiah G. Murray

[57] ABSTRACT

Apparatus is disclosed for implementing a unique data compaction technique which is capable of significantly reducing the storage requirements for alpha-numeric data-sets. The results of a computer simulation which demonstrates the power of this technique are provided. In addition, the logic circuitry required to implement this data compaction technique for the transmission of data over a communications link is given.

11 Claims, 3 Drawing Figures

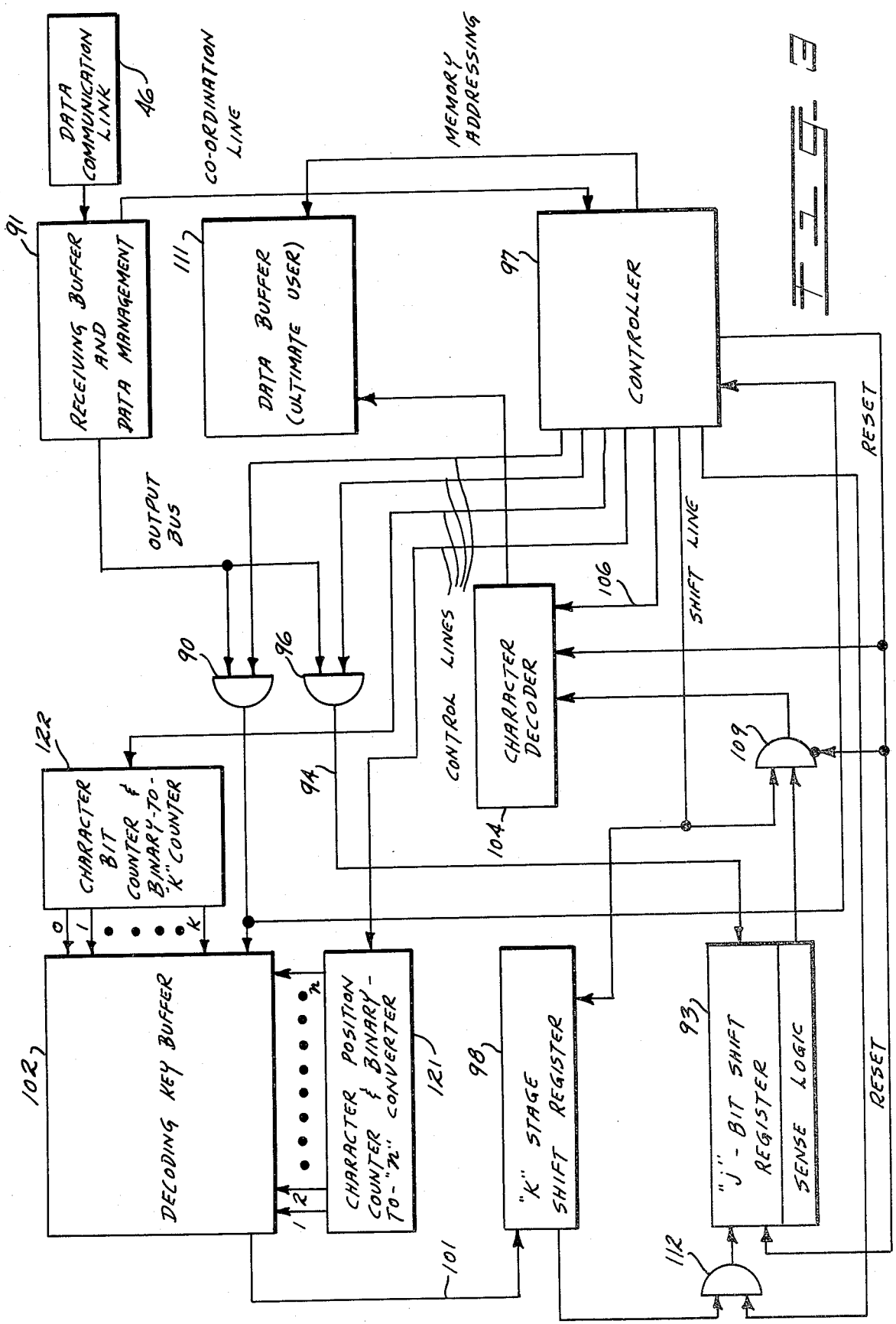

METHODS AND APPARATUS FOR COMPACTING DIGITAL DATA

GOVERNMENT LICENSE

The invention described herein may be manufactured and used by or for the Government for governmental purposes without the payment of any royalties thereon or therefor.

BACKGROUND OF THE INVENTION

1. Field of the Invention

Broadly speaking, this invention relates to methods and apparatus for compacting digital data. More particularly, in a preferred embodiment, this invention relates to methods and apparatus for compacting alpha-numeric data-sets, thereby significantly reducing the storage requirements for the data and improving its transmission efficiency.

2. Discussion of the Prior Art

The increased use by modern society of computers interconnected by communications and data links has led to a demand for improved, and more efficient, data transfer and storage techniques. Many of the data reduction schemes currently in use were developed to reduce the information content of television picture or other graphic information. Unfortunately, the techniques developed for such special data-sets rarely provide satisfactory results when applied to conventional alpha-numeric information. The reason for such variation in performance is that the integrity of picture information is not as readily affected by the removal of data redundancies as is alpha-numeric information. In addition, most of these data reduction schemes, which are either a form of delta modulation or the transmission of a truncated Fourier data spectrum, are not matched to the data class under consideration.

As a solution to this, and other problems, there is disclosed herein a unique digital data compaction technique which can significantly reduce data storage requirements and, in addition, greatly improve transmission efficiency. The technique of this invention examines the statistical character of a given data block, determines the optimum minimum length code for the block, and encodes (maps) the block into its most efficient code representation. The experimental application of this technique to physical data files has resulted in code bit reductions of from 40 to 60 percent of the original code requirements. While the technique presented in this invention operates on the redundancy inherent in all man-made data, it is significantly different from prior art data compression procedures. Such prior art procedures eliminate redundancy in a destructive manner and must apply data prediction techniques in order to restore the data to a reasonable estimate of its original form. The technique described herein re-encodes the data and its associated redundancy into a more efficient code without destroying the original data structure. A simple inverse mapping procedure restores the data to its original form without error. The data compaction technique of the instant invention can be both software and hardwire implemented, although only the hardwired implementation is discussed in detail. The technique of the instant invention will provide reduced data storage requirements and improved transmission efficiency in situations where user requirements do not permit the compromising of data integrity.

As previously mentioned, the technique described herein is oriented for application to alpha-numeric type data-sets, although it can also be applied to achieve coding reduction of picture information. However, when so utilized, it will not necessarily provide the minimum picture code, although it will return the picture, upon decoding, to its original quality.

SUMMARY OF THE INVENTION

More particularly, in a preferred embodiment, the invention comprises a method of compacting an alpha-numeric data file of the type that comprises m unique records, each of the records containing n symbols encoded in a fixed length j-bit binary code. First, the entire data file is fed into a suitable storage device such that an n×m symbol matrix is functionally established in the storage device. Each row of the matrix corresponds to a particular one of the m unique records in the data file while each of the columns in the matrix stores corresponding symbol locations from all of the m unique records.

Next, one of the columns in the matrix, typically the first, is examined to determine how many unique symbols it contains and this number is called k. This number is then compared with another number p, where $p = 2^j$. If, as will generally be the case, $k < p$, each of the symbols in this column is recoded from the original j-bit binary code into an x-bit binary code where $2^x \geq k$. Finally, this procedure is reiterated, seriatim, for all the remaining (n−1) columns in the matrix.

To practice the above method, one illustrative embodiment of the invention comprises a data buffer memory unit having a storage capacity sufficient to store the entire data file which is to be compacted. The apparatus also includes a first gating means for gating the bit stream constituting the above data file into the memory unit, where it is temporarily stored. The apparatus further includes a controller having an input lead which receives synchronization signals from the incoming bit stream. This controller counts the number of bits in this bit stream and generates, on a first output lead, a timing signal which corresponds to the end of each symbol. Another output lead contains a timing signal which corresponds to the end of each data record undergoing compaction.

Also included in this illustrative embodiment are a j-stage shift register and a second gating means, connected to and activated by the first output of the controller, for gating into the j-stage shift register the bits of the incoming bit stream which correspond to a first data symbol. The apparatus also includes an encoding/decoding key buffer memory unit and a binary-to-"k" converter, connected to the j-stage shift register, for addressing a particular row in the encoding buffer memory unit.

This embodiment also features a y-stage shift register, connected to the controller, for counting the number of symbols which have been stored in the encoding buffer memory, the number of stages y being related to the number of symbols in a record n by the formula $y \geq \log_2 n$.

Finally, the apparatus includes a binary-to-n converter, connected to the y-stage shift register, for addressing a particular column in the encoding buffer memory, whereby the buffer memory successively stores the bits of an encoding/decoding key.

The invention and its mode of operation will be more fully understood from the following detailed description, when taken with the appended drawings, in which:

DESCRIPTION OF THE DRAWINGS

FIG. 3 is a block schematic diagram of an illustrative embodiment of the invention useful for decoding the data file compacted in the apparatus shown in FIGS. 1 and 2.

DETAILED DESCRIPTION OF THE INVENTION

Figure 1:
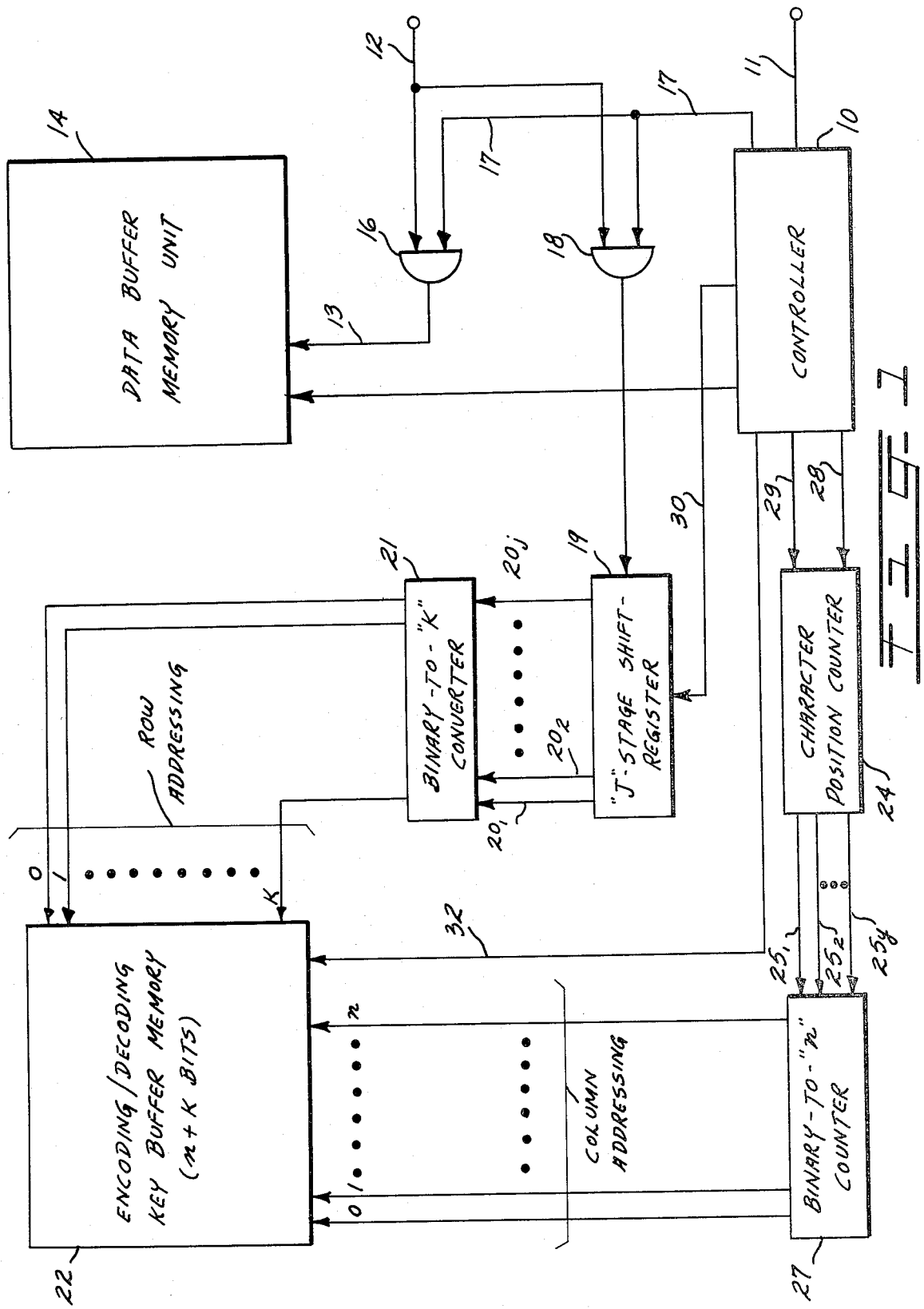
FIG. 1 is a block schematic diagram of an illustrative embodiment of the invention wherein the encoding/decoding key is generated.

Conceptually, the technique presented herein is based upon three characteristics of the man-made alpha-numeric data-sets. These are:

(1) Alpha-numeric symbols are encoded normally into fixed length binary codes not necessarily providing the most efficient bit length representation of the data;

(2) Alpha-numeric data-sets contain many repetitive space and punctuation symbols used primarily by the user to enhance the readability of the text; and (3) In a given segment of the data-set, the user does not completely use the total symbol vocabulary available.

If these characteristics are not true for any given alpha-numeric data-set, it will become evident later that significant data compaction is not feasible using the technique of this invention. Fortunately, in general, this is not the case for real-life data.

To facilitate understanding of the invention, the following terminology from computer science will be adopted. First, a symbol will be considered a given character, that is, either a letter, such as,

A, B, C, . . . ;

or a number, such as, 0, 1, 2, . . . ;

or a punctuation mark, space, etc.

A record will be considered a fixed length collection of symbols or characters, such as might appear on a line or several lines of text, and a data file or set will be considered a finite collection of data records.

Consider the representation of a data file in terms of an $n \times m$ matrix of the following form.

| RECORD 1 | $a_{11}$ | $a_{12}$ | $a_{13}$ | . | . | . | $a_{1n}$ |
|---|---|---|---|---|---|---|---|
| RECORD 2 | $a_{21}$ | $a_{22}$ | | | | | $a_{2n}$ |
| RECORD 3 | $a_{31}$ | | | | | | |
| . | . | | | | | | .(1) |
| . | . | | | | | | |
| . | . | | | | | | |
| RECORD m | $a_{m1}$ | $a_{m2}$ | $a_{m3}$ | . | . | . | $a_{mn}$ |

The rows of the matrix are records consisting of a collection of n symbols. Thus, if the file contains m records, the matrix will have n columns each containing m symbols. Examining a physically meaningful data file from this perspective results in some interesting observations. The columns of the matrix contain, on the average, only a small percentage of the symbol vocabularity. In addition, certain symbols, such as space symbols and specific letters, occur more often than others, especially in highly formatted data files. To prove that these observations are not atypical of the files under consideration, consider data files consisting of highly formatted business or financial records. Such data-sets consist primarily of columns of numbers and spaces and virtually no letters.

Another important observation about such data sets is seen only by examining the binary coding that a typical computer uses to represent an alpha-numeric character. For example, consider the standard ASC II code used by many leading computer manufacturers. This code requires the use of eight bits to represent a given alpha-numeric character. An eight-bit binary code can take on $2^8$ or 256 different one-zero sequence values. Examining any given column of the data matrix (1) one can determine the existence of k unique or distinct symbols. If k, the number of unique column symbols, is less than 256, the maximum number of 8-bit binary code representations, then the column is not encoded by an efficient coding scheme, and data compaction is possible. According to the instant invention, a more efficient encoding of the given column of symbols can readily be accomplished by coding the symbols into a binary code whose maximum number of bit sequences is not greater than the number of unique symbols in the column.

The maximum number of binary sequences which are possible with a specified string of bits will be referred to herein as the code base number, or just the base. Thus, an eight-bit binary code has a base of 256. The base of the code required to efficiently encode the symbol column under consideration is therefore "k". The number of bits required to encode the column of symbols in terms of a code specified by the new base can be determined by solving equation (2) below for the power of two which produces a value closest to the base number k.

$$2^x \geq k \qquad (2)$$

For example, if a given column contained not 256 unique symbols, but only 31, then x would be 5 since $2^5 = 32$, and $32 > 31$.

Once the number of bits required to represent symbols according to the reduced code base is determined, compaction may proceed. The re-encoding algorithm which is used at this point is really quite arbitrary. The simplest algorithm to implement comprises ordering the original unique symbols in a column of matrix (1) in monotonic order based on the decimal number equivalent of the 8-bit binary sequence used to represent the symbol. The encoding procedure is then to replace the original code sequence with an equivalent sequence in the new code base. Again, code-to-symbol assignment is accomplished by ordering the new code sequences by monotonic numeric value along side of the symbols and making a one-to-one assignment.

Therefore, using the outlined procedure, each column in the data matrix (1) may be encoded into a representation requiring, on an average, fewer bits than its original form. In many practical applications, several of the new column representations will have the same code base, for example, k = 31. However, while the code base for a given pair of columns may be the same, the symbol assignment for a given code sequence will generally not be identical. Thus, without providing additional information, decoding of the data matrix would be extremely difficult, if not impossible. Indeed, the encoding technique disclosed herein could form the basis for a cryptographic data transmission system, although this has not been explored in detail.

The solution to this seeming problem is simply the development of a decoding key. While it is impossible to synthesize a decoding key from the reduced data set itself, it is very easy to develop such a decoding key while performing the initial statistical investigation of the matrix to determine the number of unique column symbols. The question arises, however, what kind of transmission or storage overhead this decoding table will represent, and whether this additional overhead makes the entire procedure worth the effort? The answer to both of these questions can be readily ascertained by, again, considering the specific example where the original coding of the symbols in any column of data matrix (1) is in terms of eight-bit sequences. As indicated previously, there are only 256 unique eight-bit sequences which can be readily listed in monotonic order according to their decimal number equivalent. In the original data-set, the symbol-to-binary sequence correspondence of all the column elements of matrix (1) is identical. Therefore, for example, the letter "S", would have the same binary sequence representation in every column. If the re-encoding algorithm outlined herein is used, a minimum-size, straight-forward decoding key may be synthesized in the following manner. For each column in data matrix (1) allocate 256 consecutive bits of code. In storage applications, this would correspond to 256 bits of memory, while in data transmission applications, these 256 bits would be transmission bits. Each bit position in a consecutive bit string is assigned a label from 0 to 255. When a given column of matrix (1) is searched for unique symbols, a logic 1, or flag, is set in the bit location of the 256 bit string corresponding to the decimal equivalent value of the original symbol code. Therefore, after the column search is completed, a flag will be set for every unique symbol occurring in the column. A logical zero in a given position of this 256 bit column decoding key indicates nonoccurrence of the equivalent symbol in the given column. Counting the number of symbol flags occurring in the column decoding key provides the value of the new encoding base. If the monotonic ordering encoding algorithm previously suggested is adopted, relatively simple sequential shift and counting procedure may be used to assign the new code values to the data matrix symbols. The details of such a procedure are discussed later when an illustrative electronic implementation of the invention is presented. Similarly, as will be discussed later, decoding of the symbols from the new base code to their original representations may also be accomplished by a simple modification of the encoding procedure.

The original concept of the data compaction technique presented herein was conceived as a solution to the problem which many large organizations have today, namely, the continuing need to provide more efficient data storage and handling capabilities. In quest of meeting these objectives, an effort was initiated to determine the feasibility of accomplishing significant compaction of computer data files, while at the same time maintaining all of the data access and handling capabilities which were provided for standard, non-compacted data-sets. The feasibility of accomplishing such an objective according to this invention was demonstrated via a software program package. The actual software package which forms no part of this invention was written in IBM Assembly language and implemented on an IBM 360/65 computer. This operational software package provided the following capabilities:

(1) Analysis of a data file to determine symbol statistics and achievable compaction (bit saving);

(2) Determination of reduced code base numbers for the columns of the file matrix;

(3) Synthesis of the encoding/decoding key based on the outlined algorithm;

(4) Encoding of the data file in terms of the new code assignments and physical compaction of the data file. (Actually, due to the operational boundary constraints existing in computer memory systems, encoding and data compaction in this computer simulation were accomplished in two separate steps.);

(5) Organization of output compacted data file into an equivalent physical sequential (PS) or index sequential (IS) format;

(6) Sequential retrieval and decoding to original form of the entire data file;

(7) Retrieval and decoding of selected records of the data file when the compacted data-set is in index sequential organization;

(8) Deletion and updating of selected file records when the compacted data-set is in index sequential organization; and (9) Addition of new data records to a compacted index sequential file.

The software package which was used to demonstrate feasibility of the instant invention provided several additional capabilities which were required to interact with the IBM computer operating system software that are not particularly relevant to this explanation of the invention.

Satisfactory operational feasibility has been demonstrated for all the outlined program options of the compaction package except for the option which provides for the capability of adding new records to the compacted data-set. This option is currently being investigated and its success or failure does not, per se, significantly affect this invention. It should also be noted that the software package discussed above is an exploratory package developed to demonstrate concept feasibility and would require a certain degree of modification to provide a finished, optimum piece of computer software. Consequently, the details of the program are not presented or claimed herein.

Table I below is a printout of the file statistics produced by the indicated software package after it has completed an analysis of a selected column in the data matrix. The entries in this printout file statistic data sheet are the name of the data-set; the column number of the data matrix analyzed; the new encoding base, the number of bits required to encode symbols in the new base code; the number of bits that re-encoding saves per record; and the number of bytes saved for the entire file, assuming 8-bits per byte. In addition, a complete listing of all of the original 256 symbol code patterns in hexadecimal form with their alpha-numeric counterparts are presented. The three digit decimal numbers to the right of the symbol codes represent the decimal equivalent of the new, reduced, binary code patterns assigned to the symbols. Only the unique symbols existing in the selected column are assigned a reduced code pattern.

TABLE I
TYPICAL FILE ANALYSIS LISTING
REDUCED FILE STATISTICS

DATA-SET NAME = ASKIT.DICT

| RECORD POSITION | NEW BASE | REQUIRED BITS | BITS SAVED PER RECORD | BYTES SAVED PER FILE |
|---|---|---|---|---|
| 0031 | 021 | 5 | 3 | 00000223 |

VALUES USED IN UNREDUCED FILE AND NEW BASE EQUIVALENTS

| | | | | | | | |
|---|---|---|---|---|---|---|---|
| 00 | 20 | 40 000 | 60 — | 80 | A0 | C0 | E0 |
| 01 | 21 | 41 | 61 / | 81 A | A1 | C1 A 001 | E1 |
| 02 | 22 | 42 | 62 | 82 B | A2 S | C2 B 002 | E2 S 015 |
| 03 | 23 | 43 | 63 | 83 C | A3 T | C3 C 003 | E3 T 016 |
| 04 | 24 | 44 | 64 | 84 D | A4 U | C4 D 004 | E4 U 017 |
| 05 | 25 | 45 | 65 | 85 E | A5 V | C5 E 005 | E5 V 018 |
| 06 | 26 | 46 | 66 | 86 F | A6 W | C6 F 006 | E6 W 019 |
| 07 | 27 | 47 | 67 | 87 G | A7 X | C7 G | E7 X |
| 08 | 28 | 48 | 68 | 88 H | A8 Y | C8 H 007 | E8 Y 020 |
| 09 | 29 | 49 | 69 | 89 I | A9 Z | C9 I 008 | E9 Z |
| 0A | 2A | 4A | 6A | 8A | AA | CA | EA |
| 0B | 2B | 4B . | 6B , | 8B | AB | CB | EB |
| 0C | 2C | 4C & | 6C & | 8C | AC | CC | EC |
| 0D | 2D | 4D ( | 6D — | 8D | AD | CD | ED |
| 0E | 2E | 4E + | 6E & | 8E | AE | CE | EE |
| 0F | 2F | 4F & | 6F & | 8F | AF | CF | EF |
| 10 | 30 | 50 & | 70 | 90 | B0 | D0 | F0 0 |
| 11 | 31 | 51 | 71 | 91 J | B1 | D1 J | F1 1 |
| 12 | 32 | 52 | 72 | 92 K | B2 | D2 K 009 | F2 2 |
| 13 | 33 | 53 | 73 | 93 L | B3 | D3 L | F3 3 |
| 14 | 34 | 54 | 74 | 94 M | B4 | D4 M 010 | F4 4 |
| 15 | 35 | 55 | 75 | 95 N | B5 | D5 N 011 | F5 5 |
| 16 | 36 | 56 | 76 | 96 O | B6 | D6 O 012 | F6 6 |
| 17 | 37 | 57 | 77 | 97 P | B7 | D7 P 013 | F7 7 |
| 18 | 38 | 58 | 78 | 98 Q | B8 | D8 Q | F8 8 |
| 19 | 39 | 59 | 79 | 99 R | B9 | D9 R 014 | F9 9 |
| 1A | 3A | 5A | 7A : | 9A | BA | DA | FA |
| 1B | 3B | 5B $ | 7B & | 9B | BB | DB | FB |
| 1C | 3C | 5C * | 7C & | 9C | BC | DC | FC |
| 1D | 3D | 5D ) | 7D ' | 9D | BD | DD | FD |
| 1E | 3E | 5E & | 7E = | 9E | BE | DE | FE |
| 1F | 3F | 5F & | 7F & | 9F | BF | DF | FF |

Table II, below, summarizes the results obtained by analyzing a typical, computer-type, alpha-numeric data set. The number of file bits saved was computed by summing the number of bits saved per record for each column of matrix (1) and then multiplying the result by the total number of records in the file. The difference between the number of bits required to represent a symbol in the original code, compared to the bits used in the new base code, is of course, the number of bits saved for the symbol in a given record. As can be seen from Table II, a substantial bit saving results through application of the compaction algorithm. According to this invention, even when the bit overhead required to store or transmit the decoding key is included in the percent compaction computation, the result is still an impressive 53.9 percent file size reduction.

The number of bits required to maintain the decoding key is dependent only on the number of possible file symbols and the number of symbols per record. For a file using an eight-bit symbol code and a record of 80 symbols, 20,480 bits (2,560 bytes) are required for the decoding key. That is, $$(\text{\# of bits}) = (\text{\# of symbol patterns}) \times (\text{\# of symbols/record})$$

or, $$20{,}480 = 256 \times 80 \tag{3}$$

Therefore, the size of the decoding key is basically independent of the file size, provided that the original symbol code and record length ramain fixed. The file analyzed in Table II is essentially a small data-set comprising only 5,970 records. However, even though the file was small, it was possible to obtain significant reductions in storage requirements for the file, despite the high overhead of the decoding key. Of course, the impact of the decoding key bit requirement decreases as the size of the data-set increases.

TABLE II
RESULTS OF ASCIT.DICT ANALYSIS

| | |
|---|---|
| Number of Records in the File | 5,970 |
| Number of Eight-Bit Bytes Per Record | 80 bytes |
| Total Number of Bytes Per File | 47,760 bytes (382,080 bits) |
| Number of Bytes Saved Per File | 28,282 bytes (226,256 bits) |
| Average Base Code Value | 8.9 |
| Overhead Bytes for Decoding Key | 2,560 bytes (20,480 bits) |
| Percent Compaction Neglecting Decoding Key Overhead | 59.4 percent |
| Percent Compaction Including Decoding Key Overhead | 53.9 percent |

Column Code Base Tabulation

| CODE BASE | NO. OF COL. | CODE BASE | NO. OF COLS. |
|---|---|---|---|
| 1 | 10 | 16 | 1 |
| 2 | 6 | 17 | 2 |
| 3 | 8 | 18 | 3 |
| 4 | 4 | 19 | 3 |
| 5 | 2 | 20 | 1 |
| 6 | 4 | 21 | 2 |
| 7 | 5 | 23 | 2 |
| 8 | 1 | 24 | 1 |
| 9 | 3 | 25 | 3 |
| 10 | 5 | 26 | 1 |
| 11 | 5 | 29 | 1 |
| 12 | 2 | 39 | 1 |
| 13 | 1 | 216 | 1 |
| 14 | 2 | | |

A coarse estimate of the degree of compaction possible is provided by the average base code value of the file. For the file described in Table II the average base code value was 8.9. This figure basically indicates that it will take either three ($2^3 = 8$) or four bits ($2^4 = 16$) to represent a given column. Therefore, the percent compaction possible should be roughly between 50 percent and 62 percent, neglecting decoding key overhead. Analysis of several other data files, three to four times larger than the one used to obtain Table II, indicates that the typical alpha-numeric data file has an average base value of between 7 and 10. However, many more data files must be examined before reliable statistics on the average base value of alpha-numeric data-sets can be determined.

An illustrative electronic implementation of the above-discussed compaction technique, as applied to data transmission, will now be given. The type of data transmission assumed herein is serial bit transfer. For parallel bit transfer applications, only minor modification of the illustrative embodiment shown is necessary, hence, this modification is neither shown nor discussed.

FIG. 1 depicts the electronic logic required to perform the statistical analysis of a data file prior to transmission. The logic shown in this figure forms and stores the encoding/decoding key required by the compaction encoding and decoding logic. For clarity, only significant functional blocks are presented in the drawings.

Once the operational functions of these blocks is clear, an experienced logic designer will appreciate that conventional, "off-the-shelf" components and circuitry can be employed to yield the desired function.

Controller 10 in FIG. 1 comprises a set of binary counters which when preset or programmed to the character bit length and record size of the file to be transmitted, automatically counts the number of incoming bits and issues the appropriate sequence of interface command signals, as will be explained below.

The timing signals for controller 10 on line 11 are derived from the bit synchronization information associated with the data stream in the conventional manner and are not discussed in detail. The incoming bit stream on line 12 is gated by controller 10 to two different locations. First, it is placed on an input data bus 13 leadiang to a buffer memory unit 14 which stores the entire data file during the analysis period prior to encoding. This is accomplished by means of a gate 16 interposed between line 12 and buffer memory unit 14. A control line 17 connects gate 16 to controller 10, as shown. The buffer memory 14 may be a random access core, disc pack, tape memory, etc. Its size is determined by size of the data file. For speed of operation, random-access, core-type memories are preferred.

A second gate 18 loads the binary sequence corresponding to a given character into a "j"-stage shift register 19 (character buffer) having "j" parallel readout lines $20_1 \ldots 20_j$. These lines are connected to a binary-to-k converter 21, where k is the maximum base value of a "j" bit code. For example, for ASC II code "J"=8, and "K"=256, the binary-to-"K" converter 21 activates one of the address lines of an (n×k)-bit random access, memory device 22, in accordance with the numeric value of the "j"-bit sequence. The other address coordinate for memory 22, denominated the "Encoding/Decoding Buffer Memory", is provided by the y-stage binary counter 24 labeled "character position counter". The functional length of this counter is determined by the number of characters within a record, "n", according to the formula:

$$y \geq \log_2 n \quad (4)$$

In Equation (4), the smallest integer value satisfying the inequality is chosen.

Character position counter 24 has "y", parallel readout lines $25_1-25_y$ which input to a binary-to-"n" converter 27 that functions exactly as does the binary-to-k converter 21, previously discussed. Counter 24 is connected to controller 10 via line 28 and both counter 24 and register 19 receive reset signals from controller 10 via lines 29 and 30, respectively.

Each time that a new character is loaded into character buffer 19 and character position counter 24 is incremented, controller 10 issues a write command to the encoding/decoding buffer memory 22 via a line 32, thereby writing a logical "1" in the address specified by the address lines. The character buffer 19 is reset after each write command while character position counter 24 is reset for each new record.

In the apparatus depicted in FIG. 1, formation of the encoding/decoding key is accomplished simultaneously with the writing of the data file into a temporary storage buffer, buffer 14. For parallel channel bit transfer, a parallel set of input buses to the storage buffer and a parallel input to the character buffer must be provided, otherwise operation of the circuitry is entirely analogous.

Figure 2:
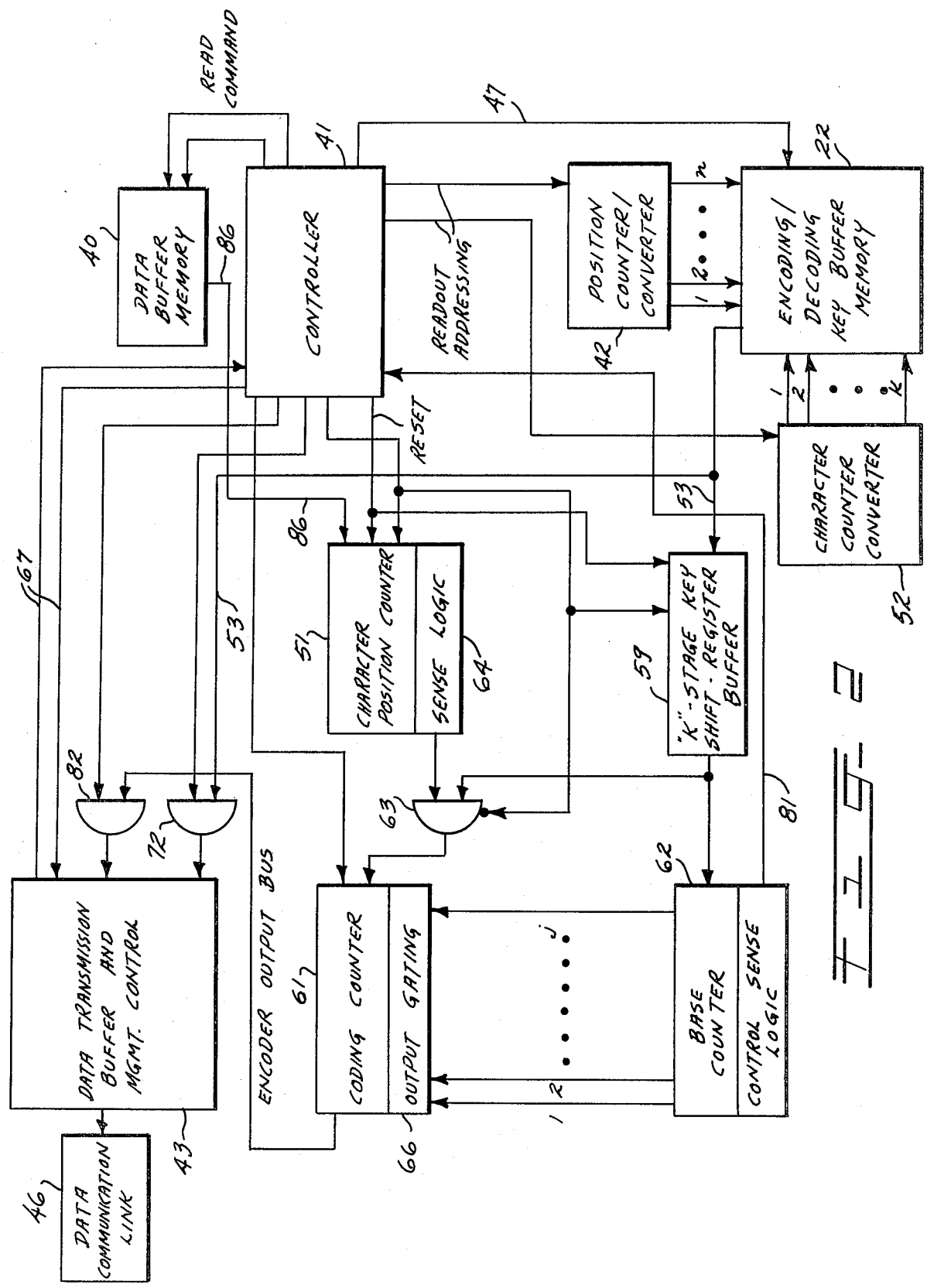
FIG. 2 is a block schematic diagram of an illustrative embodiment of the invention where the encoding/decoding key generated in the apparatus of FIG. 1 is used to compact the data file.

The apparatus required for the subsequent encoding process is depicted in FIG. 2, and this encoding will commence simultaneously with data transmission. However, storage of the data file while determining the encoding/decoding key does represent a transmission time delay. In a well designed communication system this delay should not mean that the communication link is idle. The link will ideally be transmitting a data file which has already undergone analysis and which is ready for encoding and transmission. The file transmission delay is primarily a function of the prelink transfer rate and the file size. Through the use of high-speed processing circuitry and moderate file lengths this delay can be kept within reasonable limits.

FIG. 2 depicts the encoding logic circuitry. The data buffer memory 40, controller 41, character position counter 51, and character buffer 43 shown therein serve similar, but slightly different functions from those described for FIG. 1. Controller 41 immediately transfers the encoding/decoding key generated in FIG. 1 to the data transmission buffer 43, via a key transfer bus 53 and a gate 72 for subsequent transmission to the user via communications link 46. Readout of the encoding/decoding key is accomplished by issuing a read command to the memory 22 via line 47 while simultaneously manipulating a character position counter 51 and a key buffer 59. Key buffer 59 is used in a counter mode and is systematically counted from 1 to k for a total of n repetitions. Character position counter 51 is incremented for every cycle of key buffer 59 (in the counter mode). After the transmission of the encoding/decoding key has been completed, the associated transfer bus 53 is inhibited by controller 41. This encoding/decoding key readout procedure is repeated for each record in the data file.

Immediately after the encoding/decoding key information has been transferred, character encoding is initiated. The encoding process is accomplished by the following order of events. First, for each data character loaded into the character position-counter 51 from buffer 40 via the output bus 86, the appropriate column of "k" bits from the encoding/decoding key is loaded into a k-stage shift register 59. The controller then sequentially pulses both the character position-counter 51 and the encoding key shift register 59. The logical "ones" shifted out of the shift register 59 are counted by two different binary counters, the coding and base counters 61 and 62, respectively. Sense logic 64 associated with the character position-counter 51, which is at this time functioning in the down count mode, senses the zero state thus causing a bistable gate 63 to inhibit further passage of ones to coding counter 61. Counter 61 contains the encoded character sequence. The pulsing sequence continues for a total of "k" repetitions, at which time, the base counter 62 contains the binary equivalent of the new code base. The base counter then sets the output gating circuitry 66 associated with the code counter to assure that only the minimum required code bits are shifted out of the code counter 61. Controller 41 then senses the computed base value via a lead 81 and issues the required number of shift pulses resulting in the transfer of the encoded character to the data transmission buffer 43 via a gate 82. After the character transfer is completed, controller 41 resets the appropriate counters and gates, increments the character position counter 51 and repeats the entire cycle of operations for the next data character. This cycle of events repeats until the entire data file is encoded and transferred to the transmission buffer 43.

Transmission buffer 43 either transmits the encoded data immediately or places it in a temporary holding buffer (not shown) as required by data link priorities. The data management section of transmission buffer 43 coordinates with controller 41 through a system of priority interrupts on lines 67—67 to assure optimum data transfer rates. A hold command from this unit will cause controller 41 to temporarily halt encoding and character transfer until a continue instruction is received.

FIG. 3 depicts the decoding logic required at the receiving end of data transmission link 46. This logic is essentially the inverse of the encoding logic shown in FIG. 2 and, therefore, need not be discussed in detail. The incoming decoding key is immediately transferred to an appropriate random access memory unit 102, of the type previously described, via a receiving buffer 91 and a gate 90. The character position and character bit counters 121 and 122, respectively, with their associated convertor logic, perform the same addressing functions as in the encoding logic circuitry shown in FIG. 2. Decoding is accomplished by the following sequence of operations. The incoming data character is loaded into a "j" bit shift register/down-counter combination 93 via a character bus 94 and a gate 96 under control of controller 97. The appropriate decoding key column is loaded into a "k" stage shift register 98, via line 101 from decoding key buffer 102. Controller 97 initiates a series of shift commands which sequentially shifts out the decoding key from buffer 102. Each shift command pulse from controller 97 on line 106 is counted by the shift counter character decoder 104. Simultaneously, every time a logical "1" is shifted out of the register containing the decoding key it produces a down count in the register/counter 93 containing the encoded character bit sequence by means of gate 112. This process continues until the sense logic associated with the down counter recognizes a zero condition. At this time, a bistable gate 109 is placed in a condition which inhibits the input to the character decoder. The shift command will continue to be issued until the total number of shifts is equal to the base value of the original file character code. The character decoder 104, which was prevented from counting the additional shift pulses by gate 109, contains the decoded character bit pattern. This bit pattern is subsequently transferred to the data buffer 111, user, etc. Controller 97 resets all of the appropriate counters, etc., and the process is repeated for next incoming character.

In summary, the feasibility of achieving significant compaction of alpha-numeric data files without a loss of data integrity has been conclusively demonstrated. The resultant compaction is accomplished through the application of a unique source encoding procedure which more efficiently utilizes the statistical character of man-made data files. When the instant compaction technique is applied to data files prior to transmission, significant transmission efficiency gains are possible. Storage of compacted data files also provides substantial reduction in the peripheral memory requirements of computer facilities.

The drawings depict an illustrative electronic implementation of the instant compaction technique, as applied to data transmission. These drawings show the essential logic required to form the encoding/decoding key, and perform character encoding and decoding. The associated communications interface and data management logic, being highly dependent upon the data transfer media used, and being entirely conventional were not discussed.

The processing delay, which one inherently incurs in order to form the encoding/decoding key and to perform compaction processing, is not necessarily of significant duration. Through the use of modern, high-speed logic circuitry and core-type memories it is possible to achieve the required processing at rates which are several orders of magnitude faster than the character transfer rates of conventional data links. In addition, the decrease in file transmission time will compensate for much of any residual processing delay. This was found to be the case for the computer simulations previously discussed. The time taken to read and decode a compacted data file from a peripheral device into the computer was comparable to that of merely transferring the same file, in uncompacted form, from a similar peripheral device. Therefore, the technique of this invention potentially appears capable of providing significant efficiency gains in the transmission of alpha-numeric data-sets. A similar potential for reduction of file storage requirements has been demonstrated also.

One skilled in the art may make various changes to the arrangement of parts shown and to the logic circuitry without departing from the spirit and scope of the invention.

What is claimed is:

1. Apparatus for compacting an alpha-numeric data file, said file comprising m unique records, each of said records containing n symbols with each of said symbols being encoded in a fixed-length j-bit binary code, which comprises:

a data buffer memory unit, said memory unit having a storage capacity sufficient to store said entire data file;

first gating means for gating the bit stream comprising the data file to be compacted into said memory unit for temporary storage therein;

a controller, having an input lead receiving synchronization signals from said bit stream, for counting the number of bits in said bit stream, thereby to generate timing signals on a first and second output lead respectively corresponding to the end of each symbol and each data record;

a j-stage shift register;

second gating means, connected to and actuated by the first output of said controller, for gating bits of said bit stream which correspond to a data symbol into said j-stage shift register;

an encoding/decoding key buffer memory;

a binary-to-"k" converter, connected to said j-stage shift register, for addressing a particular row of said encoding buffer memory;

a y-stage shift register, connected to said controller, for counting the number of symbols which have been stored in said encoding buffer memory, where $y \geq \log_2 n$; and a binary-to-"n" converter, connected to said y-stage shift register, to address a particular column of said encoding buffer memory, whereby said encoding buffer memory successively stores the bits of an encoding/decoding key.

2. The apparatus according to claim 1 wherein said controller includes n serially connected j-stage shift registers.

3. The apparatus according to claim 1 further comprising:
  a second controller connected to said encoding buffer memory;
  a data transmission buffer; and
  means, connected to and controlled by said second controller, for transferring the encoding key stored in said encoding key buffer memory to said data transmission buffer.

4. The apparatus according to claim 3 further comprising:
  a second data buffer memory unit, said second memory unit having a storage capacity sufficient to store said entire data file;
  a j-stage character position shift register connected to said second data buffer memory and receiving therefrom successive j-bit binary symbols;
  a k-stage key-buffer shift register connected to said encoding key buffer memory unit and receiving therefrom that portion of the encoding key corresponding to the binary symbol currently stored in said j-bit shift-register, said counter being successively incremented by said second controller from 1 to k for each of said n records and simultaneously advancing the count in said j-stage counter;
  a base counter connected to said k-stage shift register for counting the number of first binary conditions in the output thereof;
  a coding counter connected to said base counter;
  a bistable gate, connected to and controlled by said second controller, for gating the output of said k-stage shift register into said coding counter whereby said coding counter successively converts each j-bit binary coded symbol into an x-bit binary coded symbol; and
  means for gating said converted symbols, one at a time, into said data transmission buffer for subsequent transmission, together with said encoding key, to a remote location.

5. Apparatus for restoring a compacted data file to its original form, said data file comprising m unique records, each of said records containing n symbols, each of said symbols having originally been encoded in a j-bit binary code but having been compacted into an x-bit binary code at a remote location, where $2^j > 2^x$, said compacted data file and a q-bit decoding key mapping the relationship between particular symbol-to-binary relationships in said j-bit and x-bit binary codes having been transmitted to a receiving location, which comprises:
  a receiving buffer memory unit having a capacity sufficient to store the entire data record as it is received from said remote location;
  a controller connected to said buffer memory and receiving synchronizing signals from the incoming bit stream;
  a decoding key buffer having a capacity sufficient to store said decoding key;
  first gating means, connected to and controlled by said controller, for gating said decoding key word from said receiving buffer memory unit to said decoding key buffer, prior to decoding said data record;
  a k-stage shift register connected to said decoding key buffer;
  a j-stage shift register connected to and controlled by said controller;
  second gating means, connected to and controlled by said controller, for gating successive symbols in each of said n records from said receiving buffer memory unit into said j-stage bit register;
  means for transferring from said decoding key buffer to said k-stage shift register the portion of said decoding key corresponding to the symbol currently stored in said j-stage shift register;
  a bistable gate, connected to and controlled by said controller, and receiving as its input the output of said j-stage shift register and said k-stage shift register;
  a character decoder, connected to and controlled by said controller, and receiving as its input the output of said bistable gate, whereby the x-bit binary code of said symbol is converted into a j-bit binary code; and
  a utilization data buffer connected to the output of said character decoder for receiving, seriatim, the decoded symbols of each of said n records.

6. The apparatus according to claim 5 wherein said transferring means comprises:
  a character bit counter; and
  a binary-to-k converter, connected to and driven by said character bit counter, for addressing a particular row in said decoding key buffer memory unit.

7. The apparatus according to claim 6 wherein said transferring means further comprises:
  a character position counter; and
  a binary-to-n converter, connected to and driven by said character position counter, for addressing a particular column in said decoding key buffer memory.

8. A method of compacting electronically stored digital signals representing a data file of m records, each said record containing n symbols and each said symbol encoded in a fixed-length j-bit digital code of base r, which comprises the steps of:
  (a) storing said digital signals in an electronic storage device having a plurality of r-state storage cells to functionally establish therein an n×m symbol matrix of said data file, each of the rows of said matrix corresponding to a different one of said m records;
  (b) testing the digital signals in a column of said symbol matrix to determine the number k of unique symbols contained therein;
  (c) comparing signals representative of the number k and a number p, where $p = r^j$, and if $k < p$, generating an x-bit code for encoding said k unique symbols where x is the smallest integer that satisfies the relationship $r^x \geq k$;
  (d) storing in said storage device a new column of said m symbols encoded in accordance with said x-bit code;
  (e) performing method steps (b) through (c), for each of the remaining (n−1) columns in said matrix; and
  (f) constructing in said storage device an encoding key of all said x-bit codes generated in step (c).

9. A method in accordance with claim 8 and wherein r is equal to two.

10. A method of compacting an electronically stored digital data file, said file comprising m records, each said record containing n symbols with each said symbol being encoded in a fixed-length j-bit code comprising:
  (a) storing said file in a data buffer memory unit made up of a plurality of r-state memory cells;
  (b) shifting said file through a shift register having at least j stages;

(c) successively reading symbols from said shift register each time said register contains a j-bit signal associated with a different one of each said coded symbols to determine the kind of symbol stored in said shift register;

(d) storing the results of said reading step (c) in an encoding/decoding-key buffer memory using signals indicating the kind of symbol read and the number k of unique symbols associated with a given symbol position in each of said m records; and (e) changing the data in said data buffer memory unit by recoding said data with n variable-length codes each code associated with a given symbol position of all said m records and each code having a length x, wherein x is the smallest integer that satisfies the relationship, $$r^x \geq k,$$

where r is the number of states in each said memory cell and k is the number of unique symbols in said m records associated with a given symbol position.

11. A method in accordance with claim 10 and wherein r is equal to two.

* * * * *